United States Patent [19] [11] 4,100,317
Narui et al. [45] Jul. 11, 1978

[54] METAL LEAF

[75] Inventors: Hiroshi Narui; Ikuo Akune; Yosiya Kobiki, all of Kyoto, Japan

[73] Assignee: Oike & Co., Ltd., Kyoto, Japan

[21] Appl. No.: 578,817

[22] Filed: May 19, 1975

Related U.S. Application Data

[63] Continuation of Ser. No. 351,952, Apr. 17, 1973, abandoned, which is a continuation-in-part of Ser. No. 190,907, Oct. 20, 1971, abandoned.

[30] Foreign Application Priority Data

Oct. 23, 1970 [JP] Japan ................................ 45-93740

[51] Int. Cl.$^2$ .......................... B32B 3/24; B32B 15/08
[52] U.S. Cl. .................................. 428/137; 427/248 J; 427/250; 427/404; 428/332; 428/336; 428/337; 428/412; 428/461; 264/81; 204/192 C
[58] Field of Search ............... 428/138, 464, 332, 337, 428/412, 461; 427/407, 409, 252, 404, 39–41, 248, 251, 336; 264/DIG. 57, 22

[56] References Cited

U.S. PATENT DOCUMENTS

| 2,017,367 | 10/1935 | Kurz | 428/464 |
|---|---|---|---|
| 2,019,951 | 11/1935 | Caprio | 428/464 |
| 2,062,226 | 11/1936 | Kurz | 428/464 |
| 2,607,711 | 8/1952 | Hendricks | 26/317 |
| 2,622,041 | 12/1952 | Goodley | 427/252 |
| 2,767,105 | 10/1956 | Fletcher | 427/404 |
| 2,923,651 | 2/1960 | Petrullo | 427/407 |
| 2,978,376 | 4/1961 | Hulse | 428/138 |
| 3,008,850 | 11/1961 | Ulrich | 428/352 |
| 3,518,108 | 6/1970 | Heiss | 427/41 |
| 3,551,270 | 12/1970 | Sharkey | 428/138 |
| 3,677,792 | 12/1972 | Best | 427/407 |
| 3,686,018 | 8/1972 | Lindblom et al. | 427/40 |

OTHER PUBLICATIONS

Chambers et al., "Electron Beam Techniques for Ion Plating" Research & Development pp. 32–35, May 1971.

Primary Examiner—George F. Lesmes
Assistant Examiner—P. Thibodeau
Attorney, Agent, or Firm—Stevens, Davis, Miller & Mosher

[57] ABSTRACT

A metal leaf comprising (1) a resinous layer having a thickness of 0.35 to 1$\mu$, (2) a deposition layer, made of a metal selected from the group consisting of gold, silver, aluminum and copper, having a thickness of 0.03 to 0.1$\mu$, and (3) a resinous layer having a thickness of 0.35 to 1$\mu$; which being integrated in order of (1), (2) and (3) and having a thickness of 0.73 to 2.1$\mu$ and a tensile strength of 0.01 to 1.4 kg./mm$^2$. It has the same characteristics as those of a conventional metal leaf by handicrafting, and is produced by providing the metal leaf on a base film, elongating the base film to peel out of the leaf and recovering.

2 Claims, 1 Drawing Figure

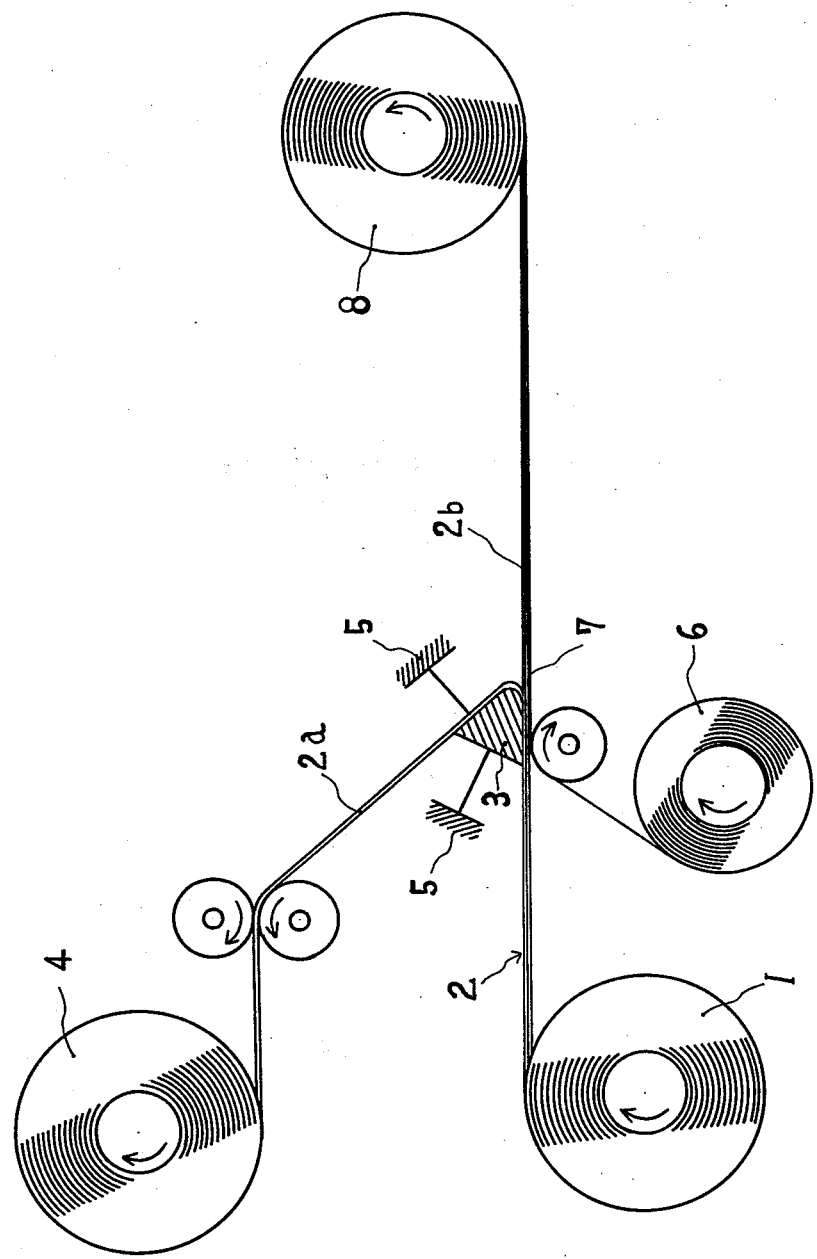

METAL LEAF

CROSS-REFERENCE TO RELATED APPLICATION

The present invention is a continuation of Ser. No. 351,952 filed Apr. 17, 1973, now abandoned, which in turn is a continuation-in-part application of copending application Ser. No. 190,907, filed Oct. 20, 1971, now abandoned.

BACKGROUND OF THE INVETION

The present invention relates to a metal leaf, particularly to a metal leaf having a good appearance and hand touchness, and being capable of industrial mass-production for producing the same.

There are known an extremely thin gold leaf and silver leaf which have a thickness of less than 1 $\mu$ and they are utilized for ornament art and industrial art, for instance, religious articles such as a Buddhist statue and a household Buddhist shrine, furnitures such as a sliding screen and a folding screen, other ornaments such as a lacquer ware and a folding fan, and the like.

As a method for producing such a metal leaf, however, only handicraft production hitherto has been carried out. In the handicraft method for producing a metal leaf, a piece of metal such as gold or silver is finely patted by a hammer to spread, so as to be a thickness of about 100 m$\mu$. Therefore, a skilled art is required for the production of metal leaves.

In addition, accompanying with the elevation of recent worker's expense the price of gold or silver leaf is significantly rised. Furthermore, the metal leaf is an extremely thin leaf so that there is never known any method of mass-production thereof.

Such a known metal leaf also has disadvantages that it is very difficult to deal with owing to its poor self-supporting property and an excessive care and attention are required in case of using. Moreover, the metal leaf has also defects that it is easily oxidized to change its color and is readily rubbed off.

OBJECT OF THE INVENTION

An object of the present invention is to provede a novel metal leaf haveng the same characteristics as those of a conventional metal leaf by handicrafting.

Futher object of the invention is to provide a metal leaf having a more excellent self-supporting property and a more easiness to deal with than a conventional metal leaf.

Still further object of the invention is to provide a metal leaf which is not oxidized to change its color and which is not readily rubbed off.

Another object of the invention is to provide a metal leaf which can be produced by means of mass-production.

These and other objects of the invention will be apparent from the following description.

BRIEF DESCRIPTION OF THE DRAWING

FIG. 1 shows an outline of a method for peeling a metal leaf of the present invention out of a base film.

DETAILED DESCRIPTION

It has now been found that the above objects can be attained by providing the following integrated material of three layers: which comprises two of resinous layer having a thickness of 0.35 to 1 $\mu$ and one metal deposition layer having a thickness of 0.03 to 0.1 $\mu$; and the integrated material having a thickness of 0.73 to 2.1 $\mu$ and a tensile strength of 0.01 to 1.4 kg./mm.$^2$. That is, the integrated material is the desired metal leaf in the present invention, and can be produced (1) by applying an under-coating composition on a base film to give an under-coating layer having a thickness of 0.35 to 1 $\mu$, (2) by depositing a metal under a vacuum on the under-coating layer to give a metal deposition layer having a thickness of 0.03 to 0.1 $\mu$ and (3) by applying an over-coating composition on the metal deposition layer to give an over-coating layer having a thickness of 0.35 to 1 $\mu$, to result in an integrated material of three layers (under-coating layer + metal deposition layer + over-coating layer), which having a thickness of 0.73 to 2.1 $\mu$ and a tensile strength of 0.01 to 1.4 kg/mm.$^2$, and then peeling the integrated material out of the said base film.

In case the metal leaf consisting of three layers is continuously and mechanically peeled out of the base film it tends often to occur cracking or breaking.

This disadvantage can be eliminated according to a method which comprises elongating the bese film having the metal leaf thereon to mechanically peel the metal leaf and putting the peeled leaf on a supporting paper to recover them. As a result, the metal leaf can be continuously and mechanically peeled out of the base film without any cracking or breaking.

In accordance with the present invention, an extremely thin metal leaf having a thickness of 0.73 to 2.1 $\mu$ can be produced by means of an industrial mass-production because the gist of the metal leaf is a metal deposition layer, the said extremely thin metal deposition layer is backed up with resinous layers, and the leaf has self-supporting property.

Although the metal leaf in the invention has resinous layers, it is possible to form into an extremely thin leaf of about 0.7 $\mu$. Since the extremely thin metal leaf is in the critical point of its self-supportability, it is influenced merely by a little external force to occur cracking or breaking. By the reason of this difficulty anybody hitherto has not challenged to produce such an extremely thin metal leaf according to an industrially modern system of mass-production.

It is one theme of the invention to produce a metal leaf without any cracking or breaking by reinforcing the critical self-supportability.

For solving the theme in the present invention, the metal leaf is formed on a base film to safely maintain it, and the base film is elongated to peel the metal leafand recovered in that state maintaining its critical self-supportability. In case of recovering the metal leaf peeled out of a base film, it is preferable that the metal leaf is put on a supporting paper. Such a supporting paper is temporarily employed in order to avoid adhering of metal leaves each other on storage and eliminated in case of using the metal leaf.

In accordance with the invention, as a result of the employment of the base film, i.e. foundation, the forming of resinous layer and the deposition of metal can be readily carried out, and thereby there can be obtained an extremely thin leaf having a thickness of 0.73 to 2.1 $\mu$, which is not inferior in physical properties and hand touchness in comparison with a conventional metal leaf by handicrafting.

Examples of the base film are a film of polytetrafluoroethylene, polyethylene, polypropylene, polyethylene terephthalate, polyvinyl chloride, polyamide, cellulose acetate, regenerated cellulose, polycarbonate, water-resistant polyvinyl alcohol, and the like. As a thickness of these films, there may be about 6 to 100 μ.

As an under-coating composition there may be employed those prepared from either thermoplastic resins or thermosetting resins. Examples of these resins are acrylic resins, thermosetting type acrylic resins such as epoxy-modified acrylic resin, vinyl chloride- vinyl acetate copolymer, polycarbonate, polyvinyl butyral, rosin-modified maleic resin, urea resin, melamine resin, nitrocellulose, cellulose acetate, alkyd resin, urethane resin, rosin, shellac, and the like. These resins alone or together with each other are employed in a form of solvent solution or aqueous solution. Examples of the solvent are halogenohydrocarbons such as trichloroethylene, ketones such as methyl ethyl ketone and methyl isobutyl ketone, lower alkyl acetates such as ethyl acetate and butyl acetate, lower alcohols such as methanol, ethanol, isopropanol and n-butanol, aromatic hydrocarbons such as xylene and toluene, cellosolves such as methyl cellosolve, ethyl cellosolve and butyl cellosolve, dioxane, and the like. If necessary, additives, e.g. plasticizer, viscosity adjusting agent, etc. may be added in the coating composition. Further, a colorant may also be added into the composition. Examples of the colorant are a solvent-soluble dyestuff and a clear lacquer consisting of resin and pigment. A thickness of the undercoating layer (the over-coating layer is also the same) is suitable to select from the range of about 0.35 to 1 μ. In case the thickness is thiner than the above-mentioned range, it is not only difficult to support a metal deposirion layer but also made a stripes of interference not to form single color, and in case thicker than the range the hand touchness of the metal leaf becomes hard.

Prior to the under-coating, a releasing agent such as silicone resins or waxes may be coated onto a base film.

Then, the metal deposition is carried out on the under-coating layer. Examples of the metal to be deposited are gold, silver, aluminum, copper, and the like.

The metal deposition may be carried out according to a conventional method, e.g. vacuum metallizing method or metal sputtering method. For instance, a pressure in the vacuum chamber is preferably about $10^{-3}$ to $10^{-6}$ Torrs, and a temperature of evaporation source is selected from the range of about 1200° to 2000° C. in accordance with a kind of metal. In case of gold or copper it is preferably carried out at about 1500° to 2000° C. and in case of silver or aluminum at about 1200° to 1600° C.

As an over-coating composition there may be employed the same composition as that in the said under-coating. Preferably both compositions are the same with each other, and thereby the curling of metal leaf can be prevented. However, a solvent having a large evaporation velocity is preferable for over-coating composition.

In accordance with the present invention, the metal leaf on a long-size base film is continuously and mechanically peeled without any cracking or breaking by elongating the base film, and then put an a supporting paper and recovered.

The method can be better understood with reference to the accompanying drawing which is the schematic representation of one specific embodiment.

In FIG. 1, 1 is a roll on which a base film 2a having metal leaf is wound up. While winding back the film 2a having the metal leaf 2b, the metal leaf 2b is peeled out of the film by turning up only the base film 2a at the position of guide bar 3 and rewound up onto a roll 4.

The rewinding onto the roll 4 is carried out with elongation to peel the metal leaf 2b mechanically out of the base film 2a. An elongating ratio of the base film 2a suitable for peeling is selected from the range of about 0.1 to 20%. If necessary, the elongation may be carried out while somewhat heating to assist elongation.

5 is an earthing. 6 is a supplying roll for supporting paper 7. While winding back from the roll 6, the supporting paper 7 is put on the metal leaf 2b side of the base film and progressed, and thereafter wound up on a winding roll 8 without any cracking or breaking. As a supporting paper there may be employed pulp-paper, rice paper or dermic paper, preferably so-called supporting paper for metal leaf.

Alternatively, the metal leaf 2b may be wound back after or instead of winding onto the roll 8 and optionally cut to give the desired product.

According to the invention, there can be provided an elegant metal leaf on the surface of which a great number of fine unevenness randomly has.

Auch a metal leaf can be obtained by the use of a base film having on the surface of which a great number of fine unevenness randomly has instead of the use of flat film.

Thus obtained metal leaf has a great number of fine unevenness randomly, so that an strong metallic luster of the leaf is weakened to give an elegant appearance. As a means for providing the above-mentioned unevenness on a surface of film, there can be carried out by a mechanical embossing, or chemical or physical scratching of the surface.

Examples of the patterns of unevenness are pearskins, silky stripes, cross stripes, honeycombs, chequers, points, and the like. A size of these patterns is preferable to be as small as possible; usually, for instance, about 0.05 to 1 mm.

Furthermore, even in case of employing a flat film the desired metal leaf can be obtained by embossing one or both sides of the obtained three layer integrated material together with the base film and peeling the metal leaf out of the base film.

As a reference, the embossing of a conventional gold leaf or silver leaf by handicrafting is entirely unable to do because of its brittleness.

The metal leaf has scarcely gas permeability. Therefore, in case the metal leaf is adhered with a foundation such as paper, fabric, wood or metal, air is occluded between them, and further, gas produced from solvent in an adhesive is also occluded in the adhesive layer to give a surface of the adhered leaf having spotted irregularity.

The above disadvantage can be eliminated by the following means. That is, above-mentioned metal leaf with or without the base film is pressed by a perforating means on which many fine needles are randomly distributed for randomly forming many fine holes which are scarcely able to notice at one view. Therefore, in case of adhering the leaf onto a foundation, air is not quite occluded between them and the leaf can be smoothly adhered along the surface of a foundation. Besides, gas produced from the solvent in adhesive in the course of drying is given off through the many holes, and accordingly an excellent adhesion processing can be carried out without any spotted irregularity on the surface of the adhered leaf.

The means of the perforation is carried out by pressing the metal leaf with a suitable perforating means on which many fine needles are randomly distributed. One example of the most simple means of perforation is that many fine needles are randomly planted in a slight projection toward the out side on a foundation. Especially, for continuously carrying out the perforation, it is preferable to make such needles on a surface of either one in a pair of rolls.

As a size of the needle, it is preferable to be a diameter of about 0.01 to 2 mm. and a length (projection length on a foundation) of about 0.01 to 2 mm., and a top part of needle is fine and sharp. The holes perforated thereby are preferable to be scarcely able to notice at one view. A suitable number of holes is selected from the range of about 5 to 3000 holes/100 cm.$^2$ preferably 50 to 1000 holes/100 cm.$^2$. Either patterns such as chequer, zigzag and random will do.

Alternatively, a perforating means having the same shape and effects as in case of planting needles can be formed by etching a surface of metal. The other perforating means can be made by adhering a finely devided sharp sands or sandy materials having a size of about 40 to 160 meshes on a foundation with an adhesive.

The following Examples illustrate preferred embodiments of the invention in which parts are by weight unless otherwise described.

EXAMPLE 1

An under-coating composition (consisted of 20 parts of vinyl chloride-vinyl acetate copolymer, 100 parts of methyl isobutyl ketone and 100 parts of ethyl acetate) was applied on a polypropylene film having a thickness of 30 $\mu$ by means of so-called gravure method (hereinafter all applications were carried out by gravure method) and dried to give an under-coating layer having a thickness of 1 $\mu$. On the under-coating layer was deposited gold under a vacuum of about 3 × 10$^{-4}$ Torrs at an evaporation temperature of 1700° C. to give a gold deposition layer having a thickness of about 75 m$\mu$. Further, an over-coating compostion (the same as the under-coating composition) was applied on the deposition layer and dried to give an over-coating layer having a thickness of 1 $\mu$.

Using the apparatus as illustrated in FIG. 1, the resultant was set so as to be the polypropylene film side in upward direction, and only base film was turned up at a guide bar, elongated in an elongating ratio of about 10% to peel out of the gold leaf, and then wound up around the film-winding roll.

On the other hand, the gold leaf thus peeled out of the base film was put on a supporting paper fed from a supplying roll which was put on the gold leaf side of base film in the under side at the position of guide bar, and progressed and recovered.

Thus obtained gold leaf is grace and is noticed neither cracking nor breaking. Besides, the gold leaf has the quite same appearance and hand touchness in comparison with a conventional gold leaf by handicrafting. A tensile strength of the resultant (test piece: 8 cm. × 4 cm.) was measured by using a tensile strength testing machine "AUTOGRAPH S-100" made by Shimadzu Seisakusho Ltd. under condition of a temperature of 20° C, a relative humidity of 60% and a tensile velocity of 100 mm./min. to give a tensile strength of 1.3 kg./mm$^2$. On the contrary, a conventional handicrafted gold leaf having a thickness of 100 m$\mu$ has a tensile strength of 0.7 kg./mm$^2$.

EXAMPLE 2

On one side of polyethylene terephthalate film having a thickness of 12 $\mu$ was preliminarily matted (size about 20 to 100 $\mu$, depth: about 5 $\mu$). An under-coating composition (consisted of 20 parts of vinyl chloride-vinyl acetate copolymer, 100 parts of methyl isobutyl ketone, 100 parts of ethyl acetate, and 2 parts of Neozapon Yellow R [trade name of yellow dye, made by BASF]) was applied on the matted film and dried to give an under-coating layer having a thickness of 1 $\mu$. On the under-coating layer was deposited aluminum under a vacuum of about 3 × 10$^{-4}$ Torrs at an evaporation temperature of 1450° C. to give an aluminum deposition layer having a thickness of 50 m$\mu$. Further, an over-coating composition (consisted of 20 parts of vinyl chloride-vinyl acetate copolymer, 100 parts of methyl ethyl ketone, 100 parts of toluene, 2 parts of Neozapon Yellow R was applied on the aluminum deposition layer and dried to give an over-coating layer having a thickness of 1 $\mu$.

Thus obtained three layer integrated material was peeled out of the base film by means of elongation, put on a leaf-supporting paper at the same time. This aluminum leaf has a fine pear-skin surface on the side of under-coating layer. Thus obtained aluminum leaf is grace and is noticed neither cracking nor breaking, and has good appearance because of the surface having many fine and random unevenness, and has a tensile strength of 0.98 kg./mm$^2$.

EXAMPLE 3

On a polyethylene terephthalate film having a thickness of 12 $\mu$ was applied a 0.1% toluene solution of silicone-melamine to give a releasing layer. An under-coating composition (consisted of 10 parts of vinyl chloride-vinyl acetate copolymer, 1 part of rosin-modified maleic resin, 100 parts of toluene, 50 parts of methyl ethyl ketone and 50 parts of ethyl acetate) was applied on the releasing layer to give an under-coating layer having a thickness of 0.35 $\mu$. Gold was deposited thereon under a vacuum of about 3 × 10$^{-4}$ Torrs at an evaporation temperature of 1700° C. to give a gold deposition layer having a thickness of about 75 m$\mu$.

An over-coating composition (consisted of 10 parts of vinyl chloride-vinyl acetate copolymer, 1 part of rosin-modified maleic resin, 100 parts of toluene, and 100 parts of ethyl acetate) was further applied on the deposition layer and dried to give an over-coating layer having a thickness of 0.35 $\mu$.

Thus obtained three layer integrated material together with the base film was embossed from both sides by using a pair of roll press consisting of silky stripes-embossing cylinder. The silky stripes have a length of about 1 mm., a width of about 0.5 mm. and a depth of about 0.1 mm.

The resultant was set so as to be a base film side in upward direction and the said base film was elongated in the same manner as described in Example 1 to peel a gold leaf out of the film. At the same time, the gold leaf was put on a leaf-supporting paper. Thus obtained gold leaf has many fine and random unevenness of silky stripes, and is grace and is noticed neither cracking nor breaking, and has a tensile strength of 0.42 kg./mm$^2$.

EXAMPLE 4

On a polypropylene film having a thickness of 30 $\mu$ was applied an under-coating composition and further a gold deposition layer, on which an over-coating layer was provided to give a three layer integrated material in the same manner as described in Example 1. Thus obtained continuous sheet was set so as to be a gold deposition layer in upward direction and passed through between rolls consisting of a pair of a perforation-roll and a press-roll. The sheet having a gold leaf was perforated by pressing it under a soft-touching pressure with the press-roll to the perforation-roll, the speed of both rolls being the same. The employed perforation-roll has sharp needles having a root diameter of 0.5 mm. and a length of 0.1 mm., which were arranged on the surface of the roll in an interval of 0.2 cm. so as to form chequer pattern. The base film of the continuous sheet having a perforated gold leaf was elongated in the same manner as described in Example 1 to peel the gold leaf out of the base film and put on a leaf-supporting paper, and recovered.

Thus obtained gold leaf is grace and is noticed neither cracking nor breaking, and has fine and random holes, which are not noticed at one view. The gold leaf has the quite same appearance and hand touchness in comparison with a conventional gold leaf by handicrafting. The gold leaf could be adhered with a foundation without any spotted unevenness to give a product being grace.

EXAMPLE 5

On a polypropylene film having a thickness of 30 $\mu$ was provided an under-coating layer and further a gold deposition layer, on which an over-coating layer was provided to give a three layer integrated material in the same manner as described in Example 1. The sheet was perforated by passing through between a pair of rolls consisting of a perforation-roll and a press-roll. As a perforation-roll there was employed that obtained by adhering a great deal of sharp sands having a size of about 40 to 160 meshes, in the ratio of 32 granules/cm$^2$., on a smooth surface of roll.

The resultant having the gold leaf perforated was peeled out of the base film according to the same elongating procedure as described in Example 1, and the gold leaf was put on a leaf-supporting paper and then recovered. The gold leaf is noticed neither cracking nor breaking and has many fine holes. In case the gold leaf was adhered with an iron plate by using an urea resin adhesive, a quite good adhering processing can be carried out without any adhesion unevenness.

EXAMPLE 6 on a polyethylene terephthalate film having a thickness of 12 $\mu$ was applied a 2% by weight of a fatty acid ester-modified wax solution obtained by dissolving in toluene to give a releasing layer. An under-coating composition (consisted of 15 parts of acrylic resin-modified alkyd resin, 9 parts of butylated melamine resin, 4 parts of nitrocellulose, 2 parts of rosin, 21 parts of ethyl alcohol, 14 parts of ethyl acetate, 28 parts of toluene and 7 parts of n-butyl alcohol) was applied on the releasing layer and dried for 30 seconds at 140° L C. to give an under-coating having a thickness of 0.8 $\mu$. Aluminum was deposited thereon under a vacuum of about 3 × 10$^{-4}$ Torrs at a temperature of 1450° C. to give a aluminum deposition layer of a thickness of 50 m$\mu$. Further, an over-coating composition (the same as the under-coating composition) was applied to give an over-coating layer having a thickness of 0.8 $\mu$.

Thus obtained aluminum leaf was peeled out of the polyethylene terephthalate film in the same manner as described in Example 1. At the same time, the leaf was put on a leaf-supporting paper.

The obtained aluminum leaf has a good appearance and hand touchness, and has a tensile strength of 0.85 kg./mm$^2$.

EXAMPLE 7

On a polyethylene terephthalate film having a thickness of 12 $\mu$ was applied a 2% by weight of a fatty acid ester-modified wax solution obtained by dissolving in toluene to give a releasing layer. An under-coating composition (consisted of 21 parts of epoxy-modified acrylic resin, 4.5 parts of nitrocellulose, 4.5 parts of rosin, 14 parts of methyl isobutyl ketone, 21 parts of toluene, 14 parts of ethyl acetate, 14 parts of ethyl alcohol and 7 parts of n-butyl alcohol) was applied on the releasing layer and dried for 40 seconds at 180° C. to give an under-coating layer having a thickness of 0.5 $\mu$. Gold was deposited thereon under a vacuum of about 3 × 10$^{-4}$ Torrs at a temperature of 1700° C. to give a gold deposition layer of a thickness of 70 m$\mu$. Further, an over-coating composition (the same as the under-coating composition) was applied to give an over-coating layer having a thickness of 0.5 $\mu$.

Thus obtained gold leaf was peeled out of the polyethylene terephthalate film in the same manner as described in Example 1. At the same time, the leaf was put on a leaf supporting paper.

The obtained gold leaf has a good appearance and hand touchness, and has a tensile strength of 1.35 kg./mm$^2$.

EXAMPLE 8

On a polytetrafluoroethylene film having a thickness of 20 $\mu$ was applied an under-coating composition (consisted of 19.5 parts of resol type phenol resin, 3 parts of nitrocellulose, 1.5 parts of polyvinyl butyral, 6 parts of rosin, 28 parts of ethyl alcohol, 14 parts of ethyl acetate, 21 parts of toluene, 7 parts of n-butyl alcohol and 2 parts of Orazol Yellow 2GL [trade name of (yellow dye, made by Ciba-Geigy]) and dried for 30 seconds at 160° C. to give an under-coating layer having a thickness of 1 $\mu$. Silver was deposited thereon under a vacuum of about 3 × 10$^{-4}$ Torrs at a temperature of 1300° C. to give a silver deposition layer of a thickness of 65 m$\mu$. Further, an over-coating composition (the same as the under-coating composition) was applied to give an over-coating layer having a thickness of 1 $\mu$.

Thus obtained silver leaf was peeled out of the polytetrafluoroethylene film in the same manner as described in Example 1. At the same time, the leaf was put on a leaf-supporting paper.

The obtained silver leaf has a golden yellow, a good appearance and hand touchness, and has a tensile strength of 0.4 kg./mm$^2$.

EXAMPLE 9

On a polytetrafluoroethylene film having a thickness of 20 $\mu$ was applied an under-coating composition (consisted of 15 parts of semi-drying alkyd resin, 9 parts of urea resin, 3 parts of nitrocellulose, 3 parts of rosin-modified maleic resin, 21 parts of ethyl alcohol, 14 parts of ethyl acetate, 28 parts of toluene and 7 parts of n-butyl alcohol) and dried for 25 seconds at 140° C. to give an under-coating layer having a thickness of 0.6 $\mu$. Copper was deposited thereon under a vacuum of about 3 × 10$^{-4}$ Torrs at a temperature of 1650° C. to give a copper deposition layer of a thickness of 50 m$\mu$. Further, a composition (the same as the under-coating composition) was applied to give an over-coating layer having a thickness of 0.6 μ.

Thus obtained copper leaf was peeled out of the polytetrafluoroethylene film in the same manner as described in Example 1. At the same time, the leaf was put on a leaf-supporting paper.

The obtained copper leaf has a good appearance and hand touchness, and has a tensile strength of 0.7 kg./mm$^2$.

EXAMPLE 10

On a polypropylene film having a thickness of 25 μ was applied an under-coating composition (consisted of 19.5 parts of novolak type phenol resin, 4.4 parts of nitrocellulose, 6 parts of rosin, 0.1 part of hexamethylenetetramine (catalyst), 28 parts of ethyl alcohol, 14 parts of ethyl acetate, 21 parts of toluene and 7 parts of n-butyl alcohol) and dried for 20 seconds at 90° C. to give an under-coating layer having a thickness of 0.5 μ. Silver was deposited thereon under a vacuum of about $3 \times 10^{-4}$ Torrs at a temperature of 1300° C. to give a silver deposition layer of a thickness of 70 mμ. Further a composition (the same as the under-coating composition) was applied to give an over-coating layer having a thickness of 0.5 μ.

Thus obtained silver leaf was peeled out of the polypropylene film in the same manner as described in Example 1. At the same time, the leaf was put on a leaf-supporting paper.

The obtained silver leaf has a good appearance and hand touchness, and has a tensile strength of 0.28 kg./mm$^2$.

EXAMPLE 11

On a polypropylene film having a thickness of 25 μ was applied an under-coating composition (consisted of 18 parts of butylated urea resin, 3 parts of nitrocellulose, 4.4 parts of polyvinyl butyral, 4.5 parts of rosin, 0.1 parts of ammonium chloride (catalyst), 21 parts of ethyl alcohol, 17.5 parts of ethyl acetate, 21 parts of toluene, 10.5 parts of n-butyl alcohol and 2 parts of Neozapon Yellow R) and dried for 20 seconds at 90° C. to give an under-coating layer having a thickness of 0.7 μ. Aluminum deposition layer of a thickness of 65 mμ. Further, a composition (the same as the under-coating composition) was applied to give an over-coating layer having a thickness of 0.7 μ.

Thus obtained aluminum leaf was peeled out of the polypropylene film in the same manner as described in Example 1. At the same time, the leaf was put on a leaf-supporting paper.

The obtained aluminum leaf has a golden yellow, a good appearance and hand touchness, and has a tensile strength of 0.6 kg./mm$^2$.

EXAMPLE 12

On a polyethylene film having a thickness of 30 μ was applied an under-coating composition (consisted of 25 parts of urethan resin, 2.5 parts of nitrocellulose, 2.5 parts of rosin, 17.5 parts of methyl isobutyl ketone, 24.5 parts of toluene, 21 parts of ethyl acetate, 7 parts of cyclohexane) and dried for 20 seconds for 90° C. to give an under-coating layer having a thickness of 0.4 μ. Aluminum was deposited thereon under a vacuum of about $3 \times 10^{-4}$ Torrs at a temperature of 1300° C. to give a aluminum deposition layer of a thickness of 70 mμ. Further, a composition (the same as the under-coating composition) was applied to give an over-coating layer having a thickness of 0.4 μ.

Thus obtained aluminum leaf was peeled out of the polyethylene film in the same manner as described in Example 1. At the same time, the leaf was put on a leaf-supporting paper.

The obtained aluminum leaf has a good appearance and hand touchness, and has a tensile strength of 0.3 kg./mm$^2$.

What we claim is:

1. A metal leaf having a critical self-supportability consisting of
    (1) a resinous base layer having a thickness of 0.35 to 1 μ and made of at least one resin selected from the group consisting of acrylic resin, vinyl chloride-vinyl acetate copolymer, polyvinyl butyral, polycarbonate, rosin-modified maleic resin, resol-type or novolak-type phenolic resin, urea resin, melamine resin, nitrocellulose, cellulose acetate, alkyd resin, urethane resin, rosin and shellac,
    (2) a vacuum-metallized intermediate metal deposition layer a metal selected from the group consisting of gold, silver, aluminum and copper, having a thickness of 0.03 to 0.1 μ, and
    (3) a resinous top layer having a thickness of 0.35 to 1 μ and made of at least one resin selected from the group consisting of acrylic resin, vinyl chloride-vinyl acetate copolymer, polyvinyl butyral, polycarbonate, rosin-modified maleic resin, resol-type or novolak-type phenolic resin, urea resin, melamine resin, nitrocellulose, cellulose acetate, alkyd resin, urethane resin, rosin and shellac; layers (1), (2) and (3) having a thickness of 0.73 to 2.1 μ and a tensile strength of 0.01 to 1.4 kg./mm$^2$.

2. The metal leaf of claim 1 further containing many randomly perforated holes which are scarcely able to be noticed at one view, said holes being present in an amount of about 5 to 3,000 holes/100 cm$^2$.

* * * * *